(12) United States Patent
Chen et al.

(10) Patent No.: US 12,426,194 B2
(45) Date of Patent: Sep. 23, 2025

(54) AIR SHIELDING MECHANISM FOR COMPUTING SYSTEM

(71) Applicant: Quanta Computer Inc., Taoyuan (TW)

(72) Inventors: Chao-Jung Chen, Taoyuan (TW);
Chih-Hsiang Lee, Taoyuan (TW);
Yao-Long Lin, Taoyuan (TW);
Cheng-Pang Kuan, Taoyuan (TW)

(73) Assignee: QUANTA COMPUTER INC., Taoyuan (TW)

(*) Notice: Subject to any disclaimer, the term of this patent is extended or adjusted under 35 U.S.C. 154(b) by 360 days.

(21) Appl. No.: 18/121,269

(22) Filed: Mar. 14, 2023

(65) Prior Publication Data
US 2024/0314965 A1    Sep. 19, 2024

(51) Int. Cl.
*H05K 7/14* (2006.01)
(52) U.S. Cl.
CPC .................. *H05K 7/1489* (2013.01)
(58) Field of Classification Search
None
See application file for complete search history.

(56) References Cited

U.S. PATENT DOCUMENTS

| | | | |
|---|---|---|---|
| 8,982,554 B2* | 3/2015 | Stewart | H05K 7/20145 361/695 |
| 9,723,756 B1* | 8/2017 | Masters | H05K 7/1489 |
| 2009/0154114 A1* | 6/2009 | Peng | G06F 1/182 361/728 |
| 2010/0087956 A1* | 4/2010 | Regimbal | H05K 7/2019 700/282 |
| 2011/0053485 A1* | 3/2011 | Huang | H05K 7/20736 454/184 |
| 2021/0298205 A1* | 9/2021 | Chen | H05K 7/20727 |
| 2021/0410314 A1* | 12/2021 | Chen | H05K 7/1489 |

* cited by examiner

*Primary Examiner* — James Wu
*Assistant Examiner* — Christopher L Augustin
(74) *Attorney, Agent, or Firm* — NIXON PEABODY LLP

(57) ABSTRACT

An air-shielding mechanism for a computing system is disclosed. A computing system includes a server chassis with a slot configured to receive a computing node. An air-shielding mechanism is positioned within the slot and includes a connecting rod movably coupled within the slot and a movable flap coupled to the connecting rod. The connecting rod rotates in a first direction in response to pressure generated by contact between the computing node inserted within the slot and the connecting rod. The movable flap is in a closed position when the computing node is absent from the slot, and the movable flap is in an open position when the computing node is fully inserted within the respective slot. The movable flap rotates in a second direction while the connecting rod is rotating in the first direction, the second direction being opposite the first direction.

20 Claims, 15 Drawing Sheets

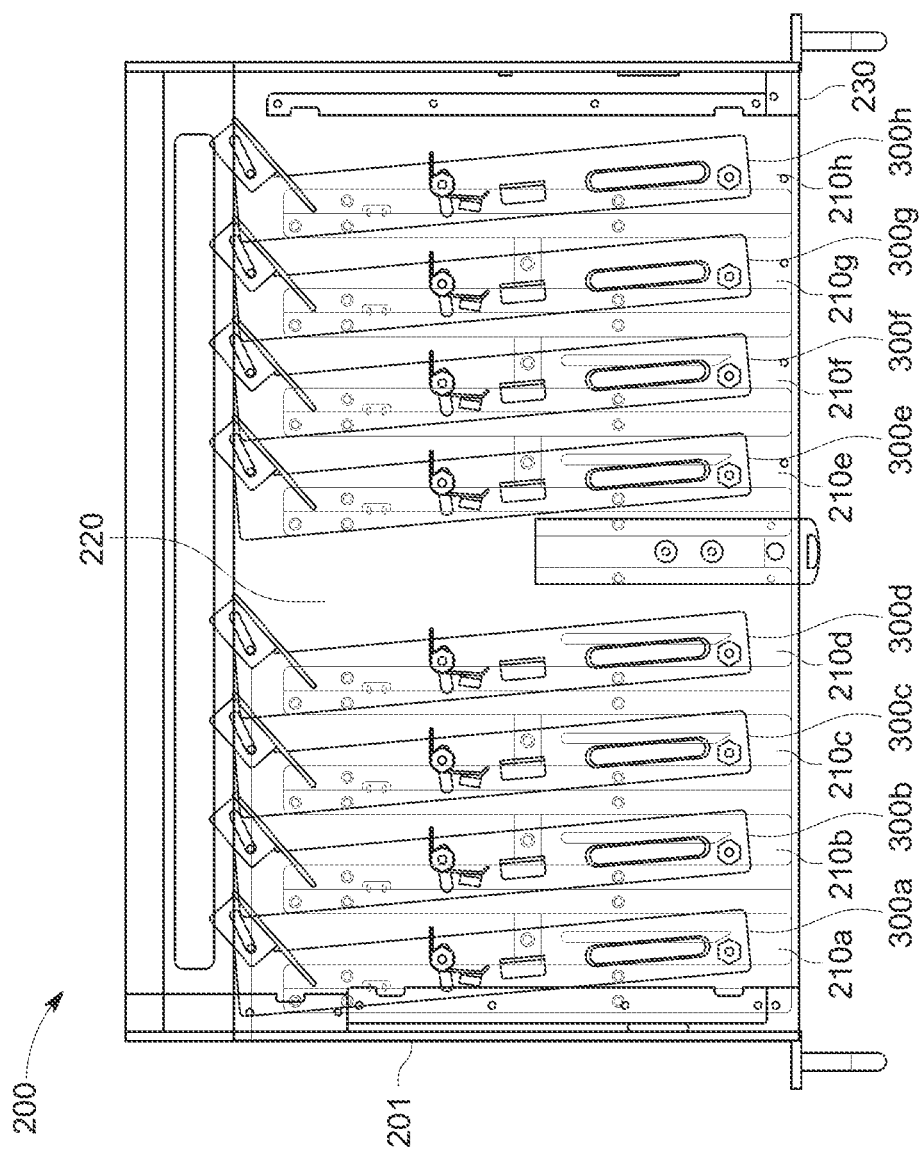

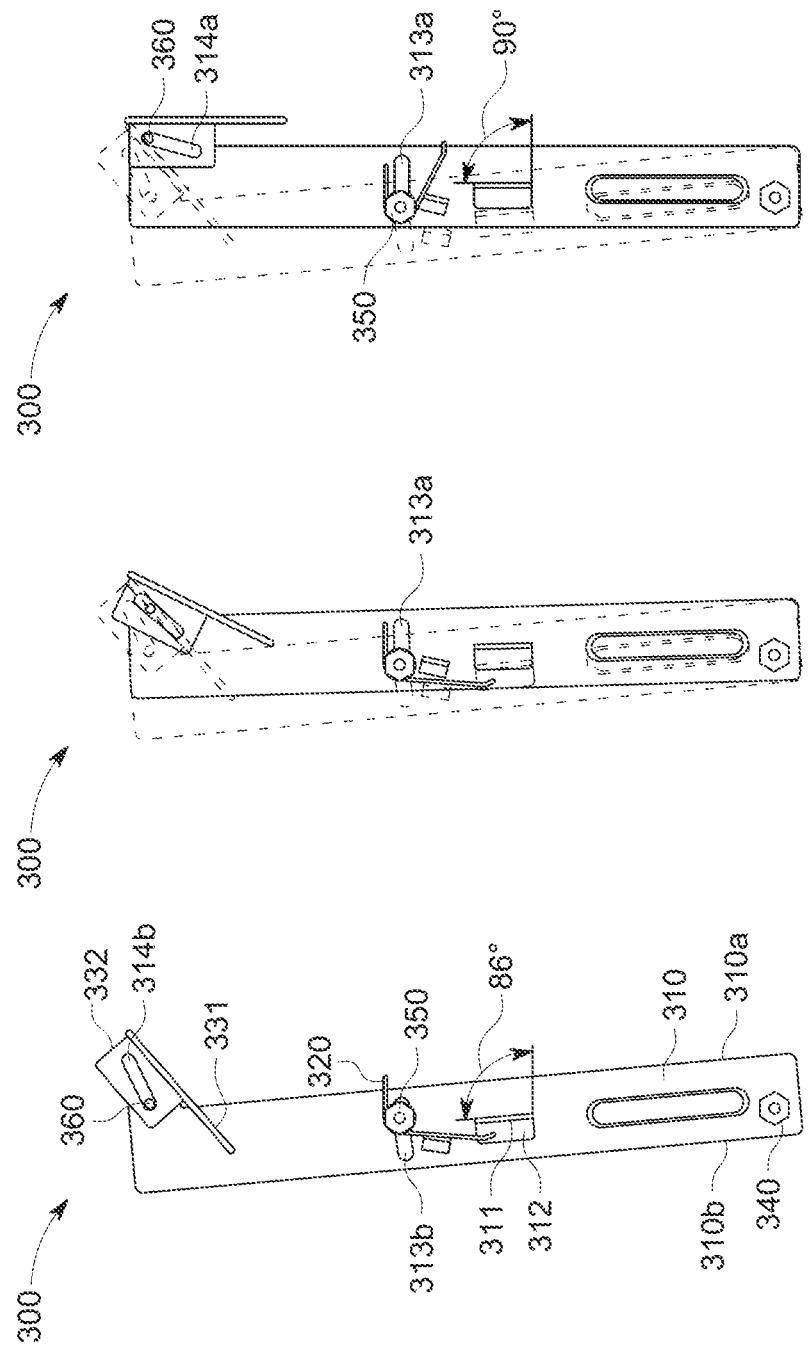

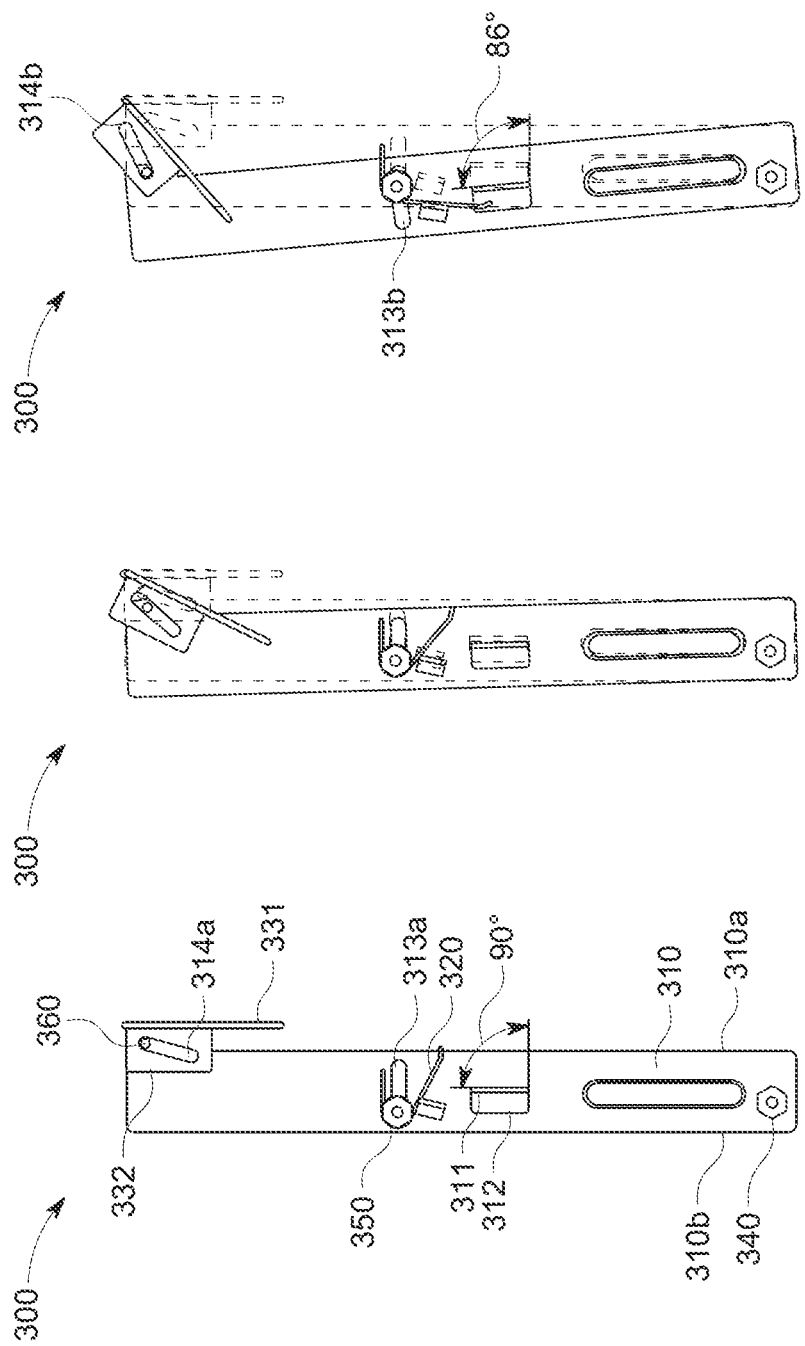

AIR SHIELDING MECHANISM FOR COMPUTING SYSTEM

FIELD OF THE INVENTION

The present invention relates generally to an air shielding mechanism for a computing system, and more specifically, to a movable flap configured to be opened in response to insertion of a computing node into a slot formed at a server chassis of the computing system.

BACKGROUND OF THE INVENTION

Servers are specialized computer systems that include numerous electrical components integrated into a single unit using a server chassis. Common to all servers is some form of a motherboard including a central processing unit (CPU), slots for memory (e.g., DDR3, DDR4, DRAM), PCIe (Peripheral Computer Interconnect Express) slots, and connectors to other components, such as hard drives, a power supply, and peripherals (e.g., USB ports, LAN and other I/O ports). Sometimes an individual component, such as a computing node, needs to be removed from the server chassis for servicing. In this case, air circulation within the internal space of the server chassis may be affected due to the empty space and/or opening generated due to the removal of the individual component.

Air circulation within the internal space of a computing system, such as a server, is important for cooling various electrical components installed therein. That is, an optimal temperature needs to be maintained for optimal operation of the components by optimizing the air circulation within the internal space of the computing system. Referring to FIG. 1A, a plurality of computing nodes (trays) 120a, 120b, 120c, 120d, 120e, 120f, 120g, 120h is assembled to a server chassis 101 of a computing system 100. Each computing node 120a, 120b, 120c, 120d, 120e, 120f, 120g, 120h is inserted into a respective slot 110a, 110b, 110c, 110d, 110e, 110f, 110g, 110h formed at the server chassis 101. In general, computing systems are designed such that air circulation in the internal space requires a specific airflow path. Referring to FIG. 1B, the airflow path may be disrupted if one 120a or more of the plurality of computing nodes are disassembled from the respective slot 110a, generating an empty space and an opening within the server chassis 101. As exemplified in FIG. 1B, the slot 110a, from which the computing node 120a is removed, is left open while the disassembled computing node 120a is serviced. Then, airflow will pass through the opening easily into the internal space of the sever chassis 101, affecting airflow passing through the computing nodes 120b, 120c, 120d, 120e, 120f, 120g, 120h remaining in the server chassis 101. This will reduce the overall heat dissipation efficiency for the computing system 100.

In some cases, an access flap may be provided to shield the opening defined in a server chassis. In general, the access flap is pivotably mounted near the opening to cover the opening. The access flap rotates when a computing node passes through the opening to enter the server chassis. However, setting up such access flaps requires a large space. Further, the rotation direction of the access flap is the same as the insertion direction of the computing node such that the design may be limited by such mechanisms.

Therefore, a need exists for a simplified air shielding mechanism requiring a smaller space within a server chassis of a computing system. A need also exists for a flap that rotates in a direction opposite the insertion direction of a computing node to provide flexibility in designing the air shielding mechanism.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

In view of the above-described problem with the conventional air-shielding mechanism of a computing system or conventional design of a server chassis/slots, the present application discloses an air-shielding mechanism having a movable flap rotatable between an open position and a closed position, requiring a less space within an internal space of a server chassis of a computing system.

According to certain aspects of the present disclosure, a computing system is disclosed. According to various embodiments, the computing system includes a server chassis with a slot configured to receive a computing node and an air-shielding mechanism positioned within the slot. The slot has an opening through which the computing node is insertable. The air-shielding mechanism has a connecting rod movably coupled within the slot. The connecting rod rotates in a first direction in response to pressure generated by contact between the computing node and the connecting rod, the pressure being generated when the computing node is inserted within the slot. The air-shielding mechanism also has a movable flap coupled to the connecting rod that is rotatable between an open position and a closed position. The movable flap is in the closed position when the computing node is absent from the slot, and the movable flap is in the open position when the computing node is fully inserted within the respective slot. The movable flap rotates in a second direction while the connecting rod is rotating in the first direction, the second direction being opposite the first direction.

According to another aspect of the computing system, a protrusion is formed on an upper side of the connecting rod, the protrusion extending generally vertically from a surface of the upper side. In some embodiments, the protrusion is a generally rectangular portion of the connecting rod that is raised generally vertically with respect to the surface of the upper side of the connecting rod. For example, three of four sides of the generally rectangular portion have been cut from the connecting rod and one of the four sides remains attached to the connecting rod such that a generally rectangular opening is formed on the connecting rod next to the protrusion. In some embodiments, the protrusion is generally parallel to two parallel side edges of the connecting rod.

According to another aspect of the computing system, the computing system further includes a first fastener rotatably connecting the connecting rod to a bottom plate of the server chassis. In some embodiments, the first fastener is positioned at a rotation center of the connecting rod. The computing system further includes a spring coupled to the connecting rod and a second fastener passing through an elongated hole formed on the connecting rod. The second fastener movably connects the connecting rod to the bottom plate of the server chassis, the second fastener holding the spring. In some embodiments, the second fastener initially positioned at a first position within the elongated hole is eventually positioned at a second position within the elongated hole when the spring is pressed in response to insertion of the computing node within the slot.

According to other aspects of the present disclosure, a multi-node computing system is disclosed. According to various embodiments, the multi-node computing system includes a server chassis with a plurality of slots configured to receive, respectively, a plurality of computing nodes. Each slot of the plurality of slots has an opening through which a respective computing node is insertable. The multi-node computing system further includes a plurality of air-shielding mechanisms positioned, respectively, at the plurality of slots.

In various embodiments, each air-shielding mechanism of the plurality of air-shielding mechanisms has a connecting rod movably coupled within the server chassis and a movable flap rotatably coupled to the connecting rod. The connecting rod rotates in a first direction in response to pressure generated by contact between a respective computing node and the connecting rod. The pressure is generated when the respective computing node is inserted within a respective slot of the plurality of slots. The movable flap rotates in a second direction while the connecting rod is rotating in the first direction, the second direction being opposite the first direction. The movable flap rotates between a closed position and an open position. The movable flap is in the closed position when the respective computing node is absent from the respective slot, and the movable flap is in the open position when the respective computing node is fully inserted within the respective slot.

According to another aspect of the multi-node computing system described above, a protrusion is formed on an upper side of the connecting rod, the protrusion extending generally vertically from a surface of the upper side. In some embodiments, the protrusion is a generally rectangular portion of the connecting rod that is raised generally vertically with respect to the surface of the upper side of the connecting rod. For example, three of four sides of the generally rectangular portion have been cut from the connecting rod and one of the four sides remains attached to the connecting rod such that a generally rectangular opening is formed on the connecting rod next to the protrusion. In some embodiments, the protrusion is generally parallel to two parallel side edges of the connecting rod. In some embodiments, the protrusion of the connecting rod is configured to contact the respective computing node inserted to the respective slot through the respective opening.

According to another aspect of the multi-node computing system described above, the connecting rod is configured to rotate clockwise in response to the pressure generated by contact between the inserted computing node and the protrusion of the connecting rod. In some embodiments, the movable flap is configured to rotate counterclockwise in response to the pressure. For example, the movable flap is opened progressively according to the rotation of the movable flap until the computing node is fully inserted within the slot. An airflow path to an internal space of the server chassis is established when the computing node is fully inserted within the slot and when the movable flap is fully open.

According to another aspect of the multi-node computing system described above, the movable flap is rotatably coupled to the connecting rod via a fastener comprising a pin or screw. In some embodiments, the movable flap includes a main plate extending generally vertically with respect to a surface of an upper side of the connecting rod and a coupling portion coupled to one side of the main plate. In some embodiments, the coupling portion of the movable flap includes a first part coupled to the one side of the main plate via at least one fastener and a second part generally vertically extending from the first part. For example, the upper side of the connecting rod and an upper side of the second part of the coupling portion are parallel, the fastener penetrating the second part of the coupling portion of the movable flap.

According to another aspect of the multi-node computing system described above, the multi-node computing system further includes a first fastener rotatably connecting the connecting rod to a bottom plate of the server chassis, the first fastener positioned at a rotation center of the connecting rod. In some embodiments, the multi-node computing system further includes a spring coupled to the connecting rod and a second fastener passing through an elongated hole formed on the connecting rod. For example, the second fastener connects the connecting rod to the bottom plate of the server chassis, the second fastener holding the spring.

According to another aspect of the multi-node computing system described above, when the movable flap is in the closed position, the second fastener is at a first position within the elongated hole. According to another aspect of the multi-node computing system described above, when the movable flap is in the closed position, the connecting rod is tilted with respect to a front side of the server chassis such that an angle between the connecting rod and the front side of the server chassis is less than 90° or 89°, 88°, 87°, 86°, or 85°.

According to another aspect of the multi-node computing system described above, when the movable flap is in the open position, the second fastener is at a second position within the elongated hole. According to another aspect of the multi-node computing system described above, when the movable flap is in the open position, the connecting rod rotated in the first direction is generally vertical with respect to the front side of the server chassis or an angle between the rotated connecting rod and the front side of the server chassis is 90° or about 90°.

According to other aspects of the present disclosure, a method for controlling an air-shielding mechanism included in a computing system is disclosed. The computing system includes a server chassis with a slot configured to receive a computing node, the slot having an opening through which the computing node is insertable. The air-shielding mechanism is positioned within the slot. The air-shielding mechanism includes a connecting rod movably coupled within the slot and a movable flap coupled to the connecting rod. The movable flap is rotatable between an open position and a closed position.

According to various embodiments, the method for controlling the air-shielding mechanism includes receiving the computing node within the slot; rotating the connecting rod in a first direction in response to pressure generated by contact between the received computing node and the connecting rod; and rotating the movable flap in a second direction to open the movable flap while the connecting rod is rotating in the first direction, the second direction being opposite the first direction. The movable flap is in the open position when the computing node is fully inserted within the respective slot.

According to another aspect of the method described above, the method further includes removing the computing node from the slot; rotating the connecting rod in the second direction in response to release of the pressure, the release of the pressure caused by removal of the computing node from the slot; and rotating the movable flap in the first direction to close the movable flap while the connecting rod is rotating in the second direction. The movable flap is in the closed position when the computing node is absent from the slot.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

FIG. 2C is a top view of a portion of a computing system with a plurality of air-shielding mechanisms, according to certain aspects of the present disclosure.

FIGS. 3A-3C are top views of an air-shielding mechanism to explain an opening mechanism, according to certain aspects of the present disclosure.

FIGS. 5A-5C are top views of an air-shielding mechanism to explain a closing mechanism, according to certain aspects of the present disclosure.

Figure 1A:
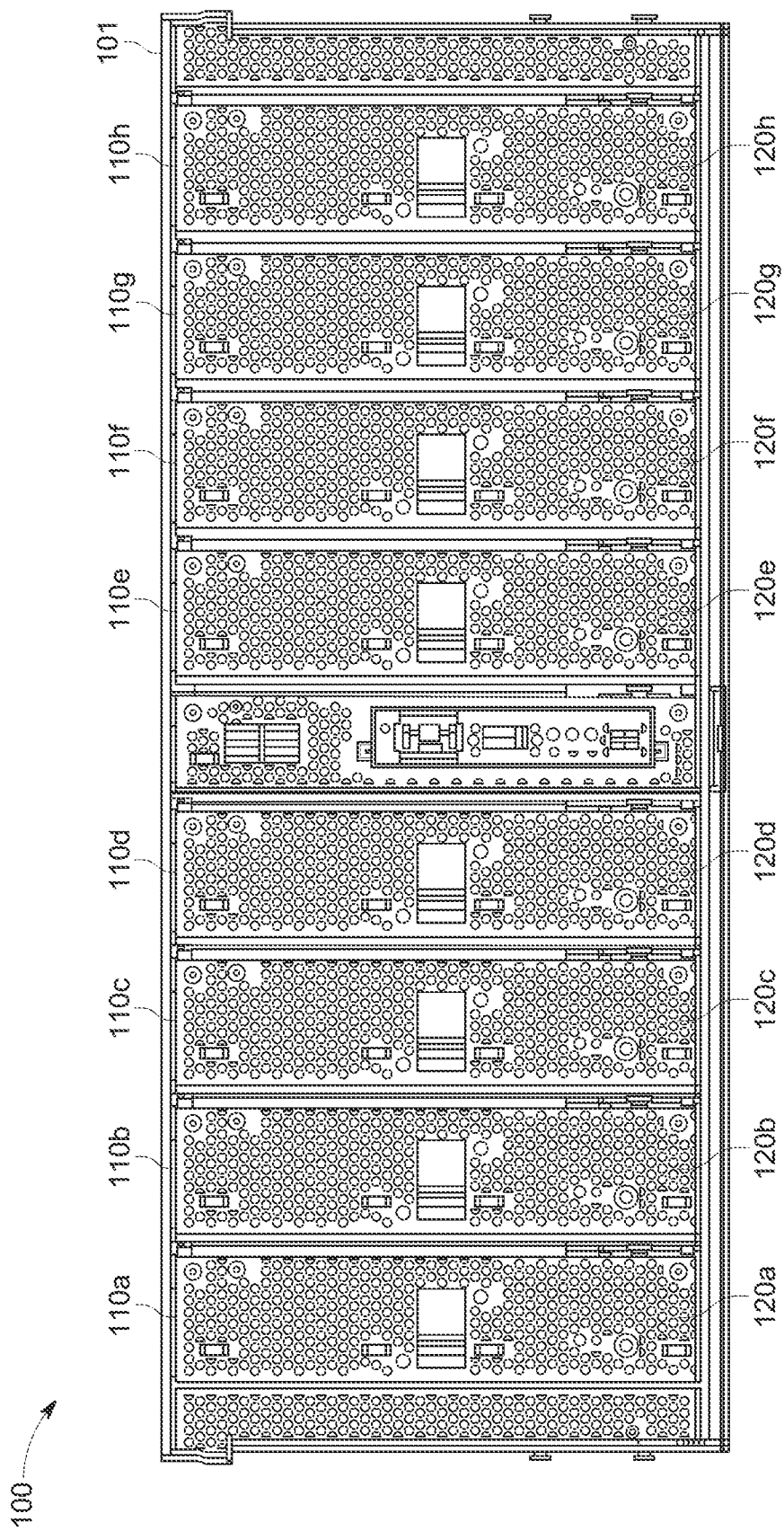
FIG. 1A is a front view of a prior art computing system with a plurality of computing nodes installed therein.
Figure 1B:
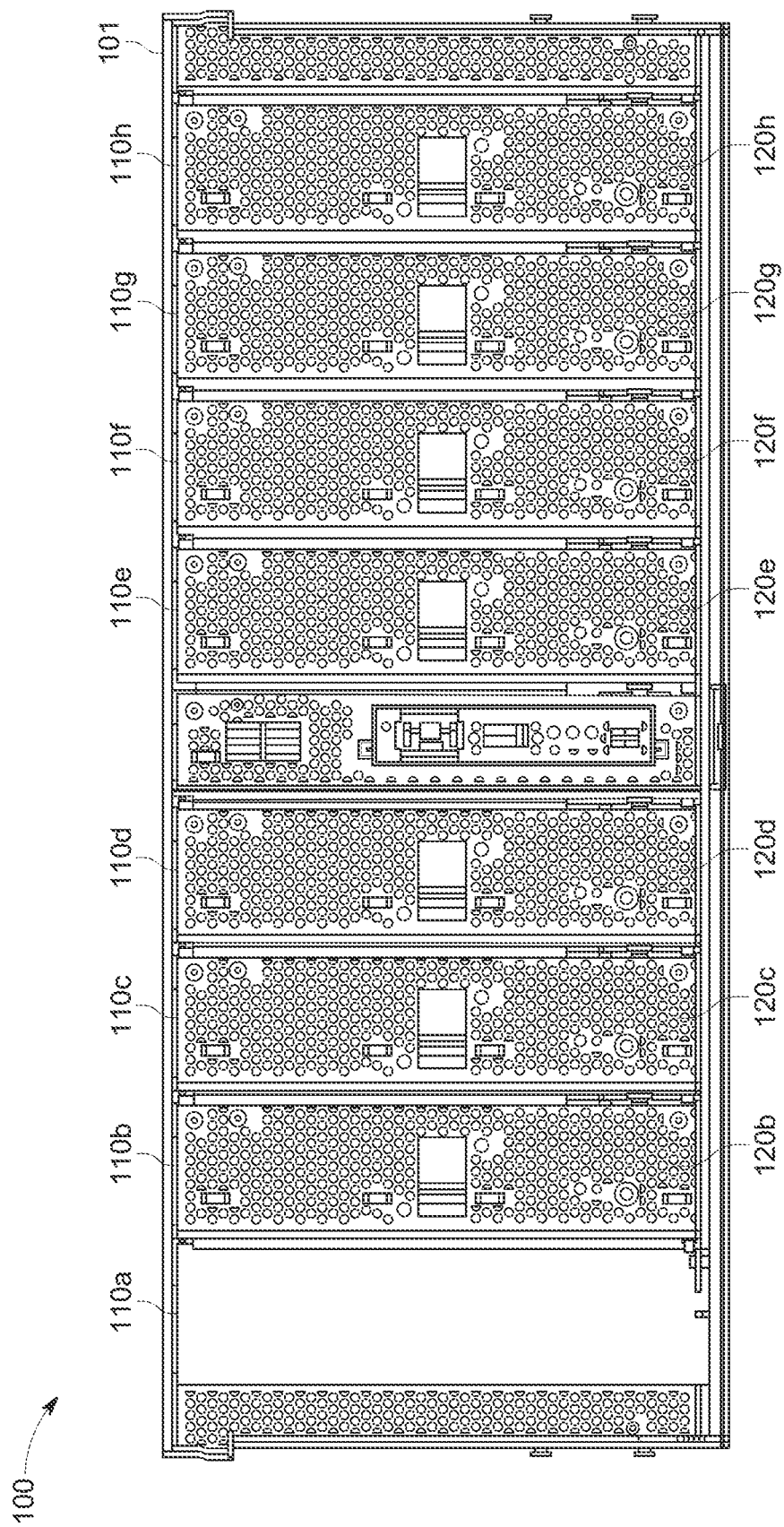
FIG. 1B is a front view of the prior art computing system shown in FIG. 1A with one computing node removed therefrom.

Elements in the figures are illustrated for simplicity and clarity and have not necessarily been drawn to scale. For example, the dimensions and/or relative positioning of some of the elements in the figures may be exaggerated relative to other elements to help improve understanding of various features.

While the present disclosure is susceptible to various modifications and alternative forms, specific implementations have been shown by way of example in the drawings and will be described in further detail herein. It should be understood, however, that the present disclosure is not intended to be limited to the particular forms disclosed. Rather, the present disclosure is to cover all modifications, equivalents, and alternatives falling within the spirit and scope of the present disclosure as defined by the appended claims.

DETAILED DESCRIPTION

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 2A:
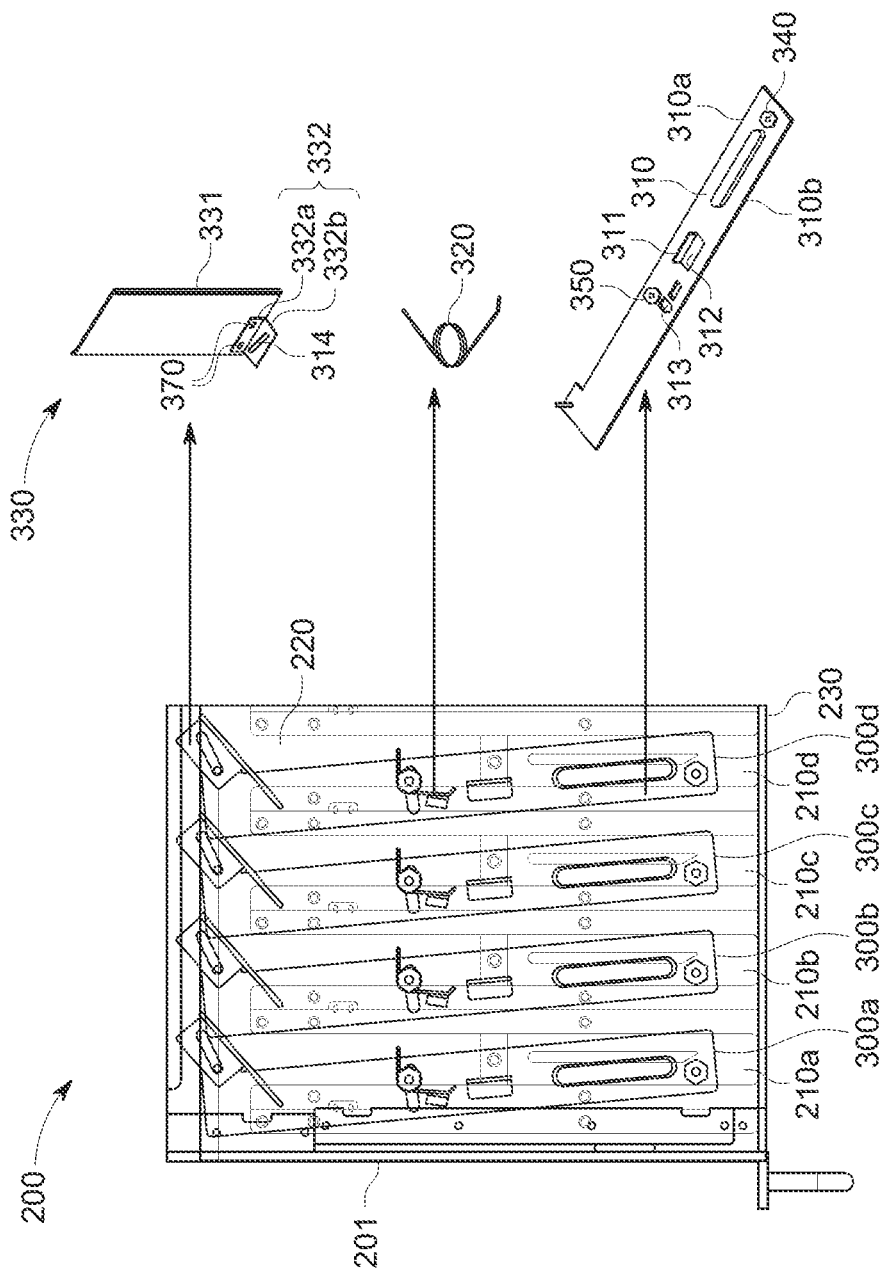
FIG. 2A is a top view of a portion of a computing system with an air-shielding mechanism, according to certain aspects of the present disclosure.
Figure 2B:
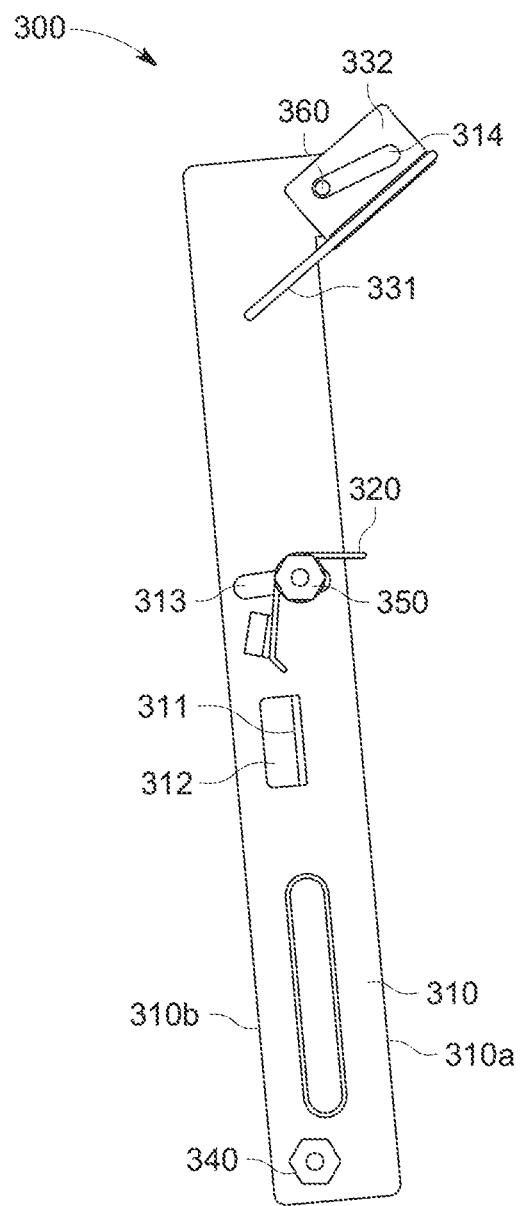
FIG. 2B is a top view of the air-shielding mechanism shown in FIG. 2A, according to certain aspects of the present disclosure.

A computing system 200 with a plurality of air-shielding mechanisms 300 and a structure of the air-shielding mechanism 300 according to various embodiments of the present invention are shown in FIGS. 2A-2C. Referring to FIGS. 2A and 2C, the computing system 200 includes a server chassis 201 with a plurality of slots 210a, 210b, 210c, 210d, 210e, 210f, 210g, 210h configured to receive a plurality of computing nodes. Each of the slots 210a, 210b, 210c, 210d, 210e, 210f, 210g, 210h has an opening through which the computing node 400 (shown in FIGS. 6A-6C) is insertable.

Each slot 210 (210a, 210b, 210c, 210d, 210e, 210f, 210g, 210h) has an air-shielding mechanism 300 (300a, 300b, 300c, 300d, 300e, 300f, 300g, 300h) positioned within the slot. Referring to FIGS. 2A-2C, the air-shielding mechanism 300 has a connecting rod 310 movably coupled within the slot 210. The air-shielding mechanism 300 also has a movable flap 330 coupled to the connecting rod 310. The movable flap 330 is rotatable between an open position (shown in FIG. 3A) and a closed position (shown in FIG. 3C).

In some embodiments, the computing system 200 or the air-shielding mechanism 300 further includes a first fastener 340 rotatably connecting the connecting rod 310 to a bottom plate 220 of the server chassis 201 within the respective slot 210. The first fastener 340 is positioned at a rotation center of the connecting rod 310. See B in FIG. 4A. In some embodiments, the computing system 200 or the air-shielding mechanism 300 further includes a spring 320 coupled to the connecting rod 310. For example, the spring 320 includes a torsion spring. In some embodiments, the computing system 200 or the air-shielding mechanism 300 further includes a second fastener 350 passing through an elongated hole 313 formed on the connecting rod 310. For example, each of the first fastener 340 and the second fastener 350 is a pin or a screw. The second fastener 350 passes through the connecting rod 310 via the elongated hole 313 and is coupled to the bottom plate 220 of the server chassis 201. In some embodiments, the second fastener 350 also passes through the torsion spring 320. Thus, the second fastener 350 holds the spring 320 in position.

Referring to FIGS. 2A and 2B, in some embodiments, a protrusion 311 is formed on an upper side of the connecting rod 310. The protrusion 311 extends generally vertically from a surface of the upper side of the connecting rod 310. In some embodiments, the protrusion 311 is a generally rectangular portion of the connecting rod 310 that is raised generally vertically with respect to the surface of the upper side of the connecting rod 310. As shown in FIG. 2A, three of four sides of the generally rectangular portion are cut from the connecting rod 310 and one of the four sides remains attached to the connecting rod 310 such that a generally rectangular opening 312 is formed on the connecting rod 310 next to the raised protrusion 311. The protrusion 311 is generally parallel to two parallel side edges 310a, 310b of the connecting rod 310.

Further, referring to FIGS. 2A and 2B, in some embodiments, the movable flap 330 includes a main plate 331 extending generally vertically with respect to a surface of an upper side of the connecting rod 310. The movable flap 330 further includes a coupling portion 332 coupled to one side of the main plate 331. Referring to FIG. 2A, in some embodiments, the coupling portion 332 includes a first part 332a coupled to the one side of the main plate 331 via at least one fastener 370. For example, the at least one fastener 370 includes a screw. The coupling portion 332 further includes a second part 332b generally vertically extending from the first part 332a such that the upper side of the connecting rod 310 and an upper side of the second part 332b of the coupling portion 332 are parallel. The movable flap 330 is rotatably coupled to the connecting rod 310 by a third fastener 360. For example, the third fastener 360 includes a pin or screw. The third fastener 360 penetrates the second part 332b of the coupling portion 332 of the movable flap 330. In some embodiments, a hole 314 is formed on the coupling portion 332 of the movable flap 330. In some embodiments, the hole 314 is elongated such that a first position 314a and a second position 314b are included in the hole 314. See FIGS. 3A, 3C, 5A, and 5C. Also see A in FIG. 4A and FIGS. 4B and 4C.

In some embodiments, the second fastener 350 is initially positioned at a first position 313a (see FIGS. 3A, 3C, 5A, and 5B) within the elongated hole 313 when the movable flap 330 is in the closed position, as shown in FIGS. 3A and 5C. That is, referring to C in FIG. 4A, the movable flap 330 is forced by the spring 320 to be in the closed position when no computing node 400 is inserted into the slot 210. When the spring 320 is pressed in response to insertion of the computing node 400 within the slot 210, the connecting rod 310 moves and the second fastener 350 is eventually positioned at a second position 313b (see FIGS. 3A, 3C, 5A, and 5B) within the elongated hole 313 such that the movable flap 330 is in the open position, as shown in FIGS. 3C and 5A.

In some embodiments, the third fastener 360 is initially positioned at a first position 314a (see FIGS. 3A, 3C, 5A, and 5B) within the elongated hole 314 when the movable flap 330 is in the closed position, as shown in FIGS. 3A and 5C. Also see A in FIG. 4A. When the spring 320 is pressed in response to insertion of the computing node 400 within the slot 210, the movable flap 330 moves and the third fastener 360 is eventually positioned at a second position 314b (see FIGS. 3A, 3C, 5A, and 5B) within the elongated hole 314 such that the movable flap 330 is in the open position, as shown in FIGS. 3C and 5A.

Figure 6A:
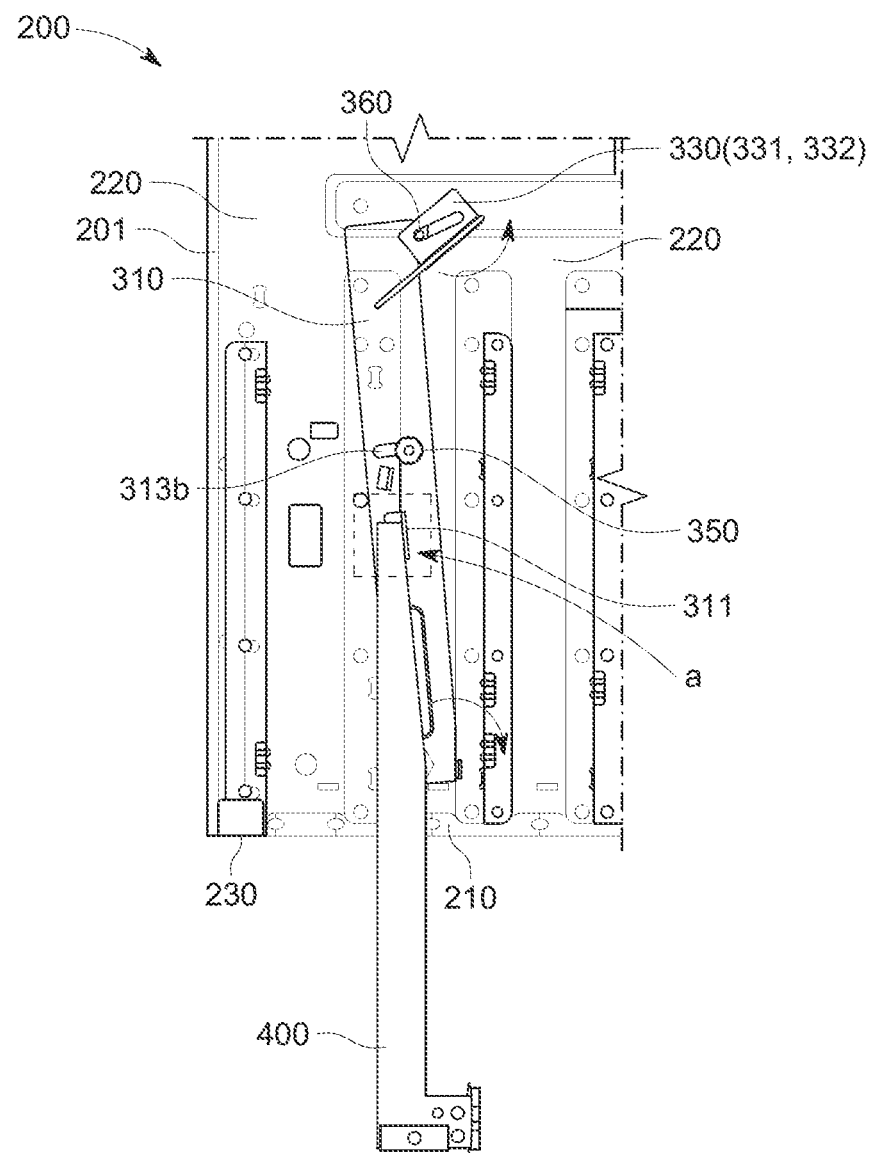
FIGS. 6A-6C are top views of a portion of a computing system with an air-shielding mechanism to explain an opening mechanism, according to certain aspects of the present disclosure.
Figure 6B:
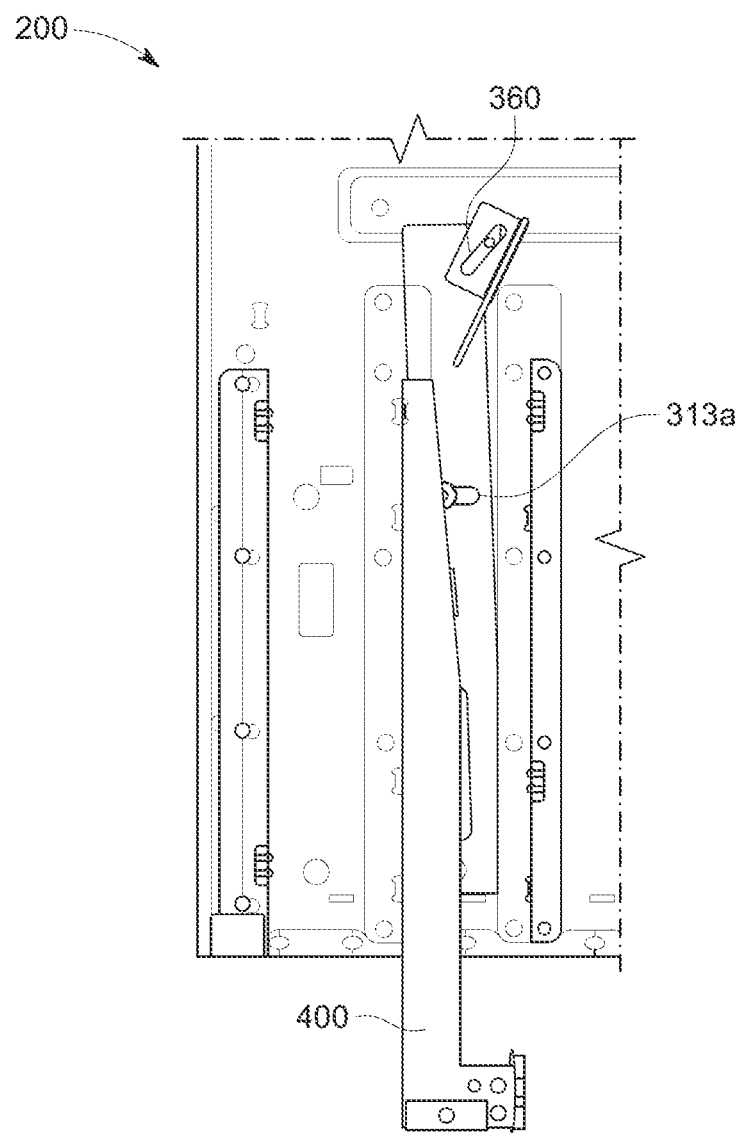
Figure 6C:
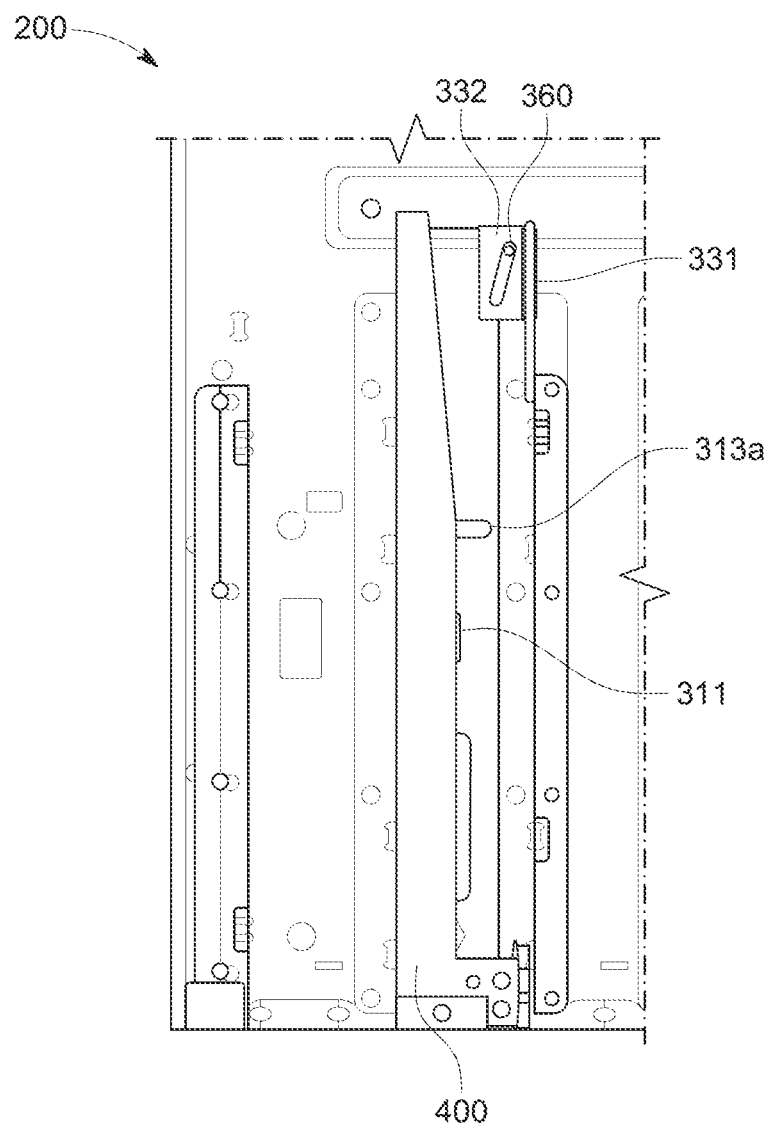

In some embodiments, the connecting rod 310 rotates in a first direction or clockwise in response to pressure generated by contact between the computing node 400 and the connecting rod 310. In some embodiments, the computing node 400 contacts the protrusion 311 when the computing node 400 is inserted into the slot 210, as shown in FIG. 6A. The protrusion 311 keeps being pushed by the computing node 400 being inserted into the slot 210, as shown in FIGS. 6B and 6C. Thus, the pressure is generated when the computing node 400 is inserted within the slot 210.

Figure 4A:
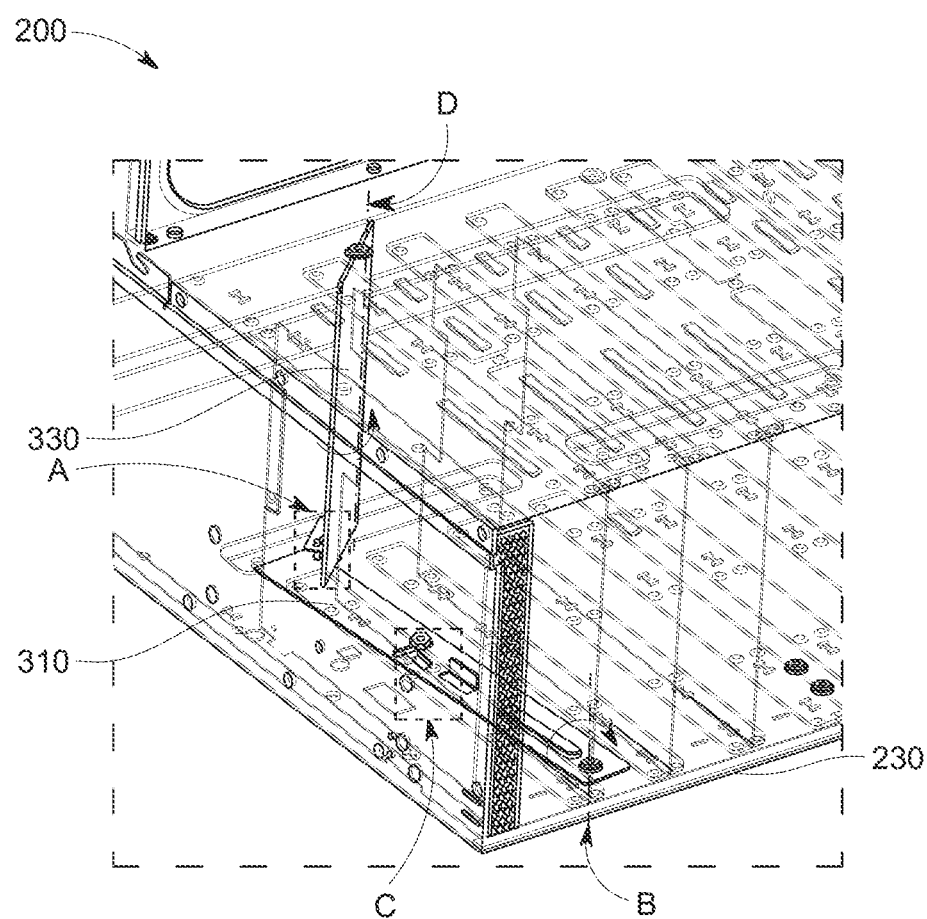
FIGS. 4A-4C are perspective views of a portion of a computing system with an air-shielding mechanism to explain an opening mechanism, according to certain aspects of the present disclosure.
Figure 4B:
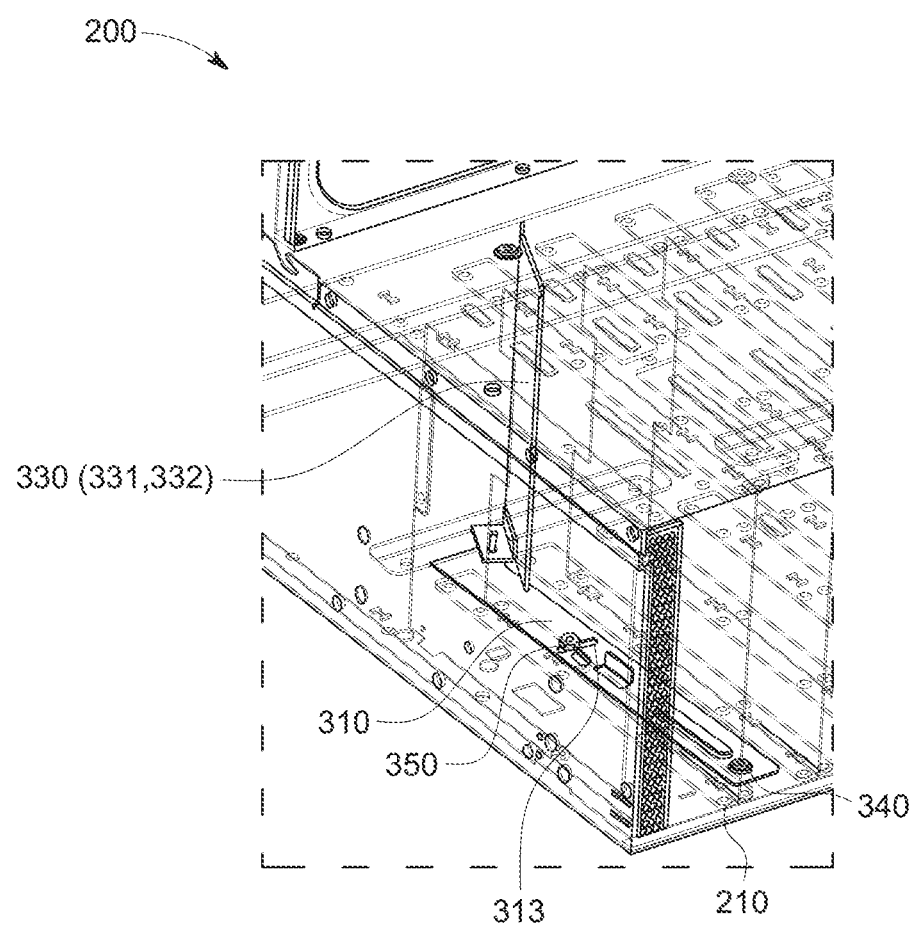
Figure 4C:
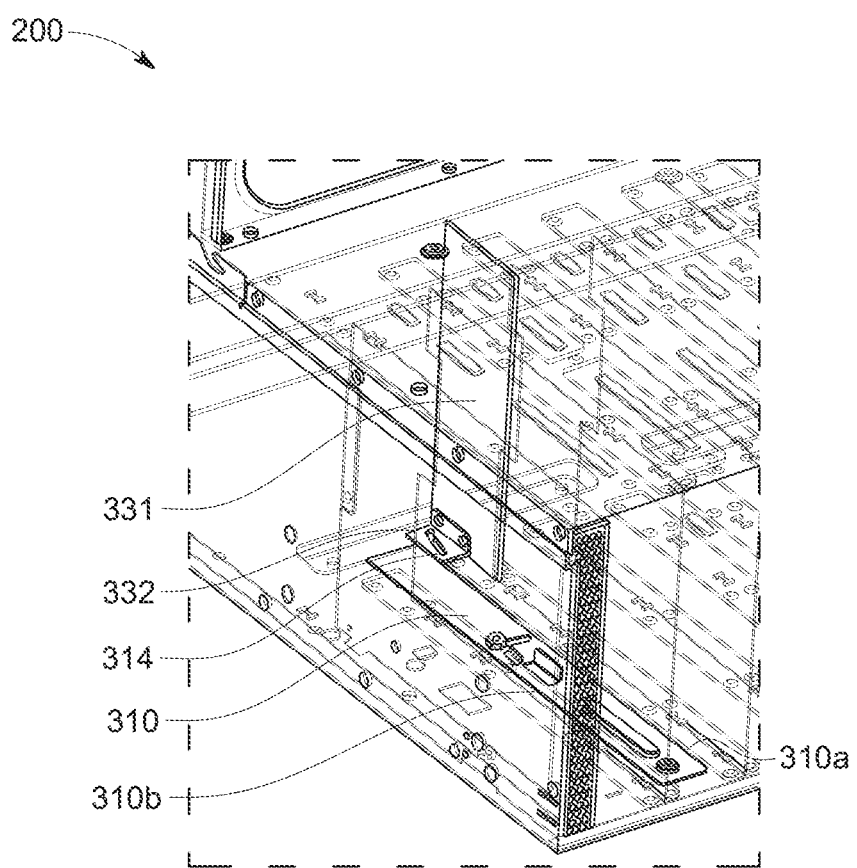
Figure 7A:
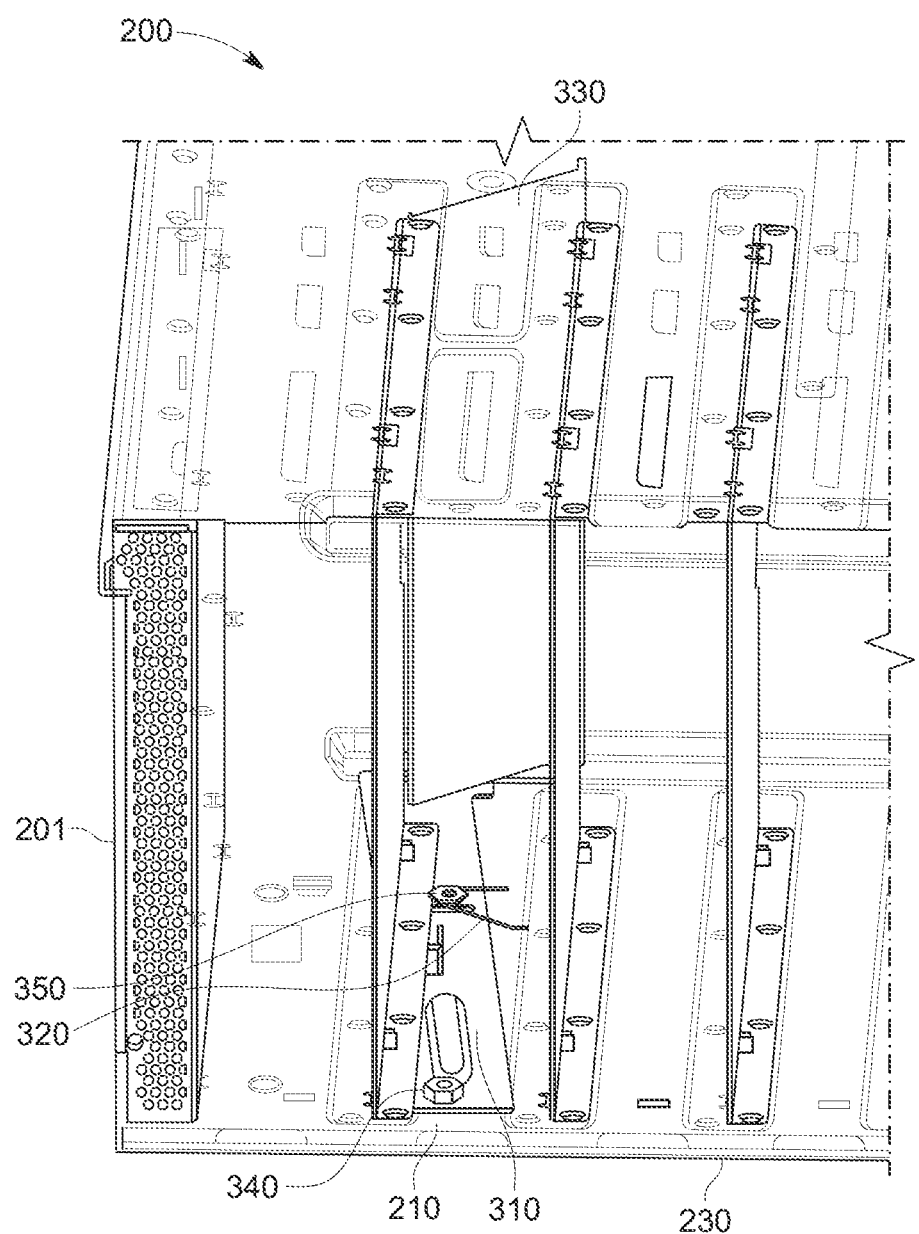
FIGS. 7A and 7B are front perspective views of a portion of a computing system with an air-shielding mechanism, according to certain aspects of the present disclosure; the air-shielding mechanism being in a closed configuration in FIG. 7A and the air-shielding mechanism being in an open configuration in FIG. 7B.
Figure 7B:
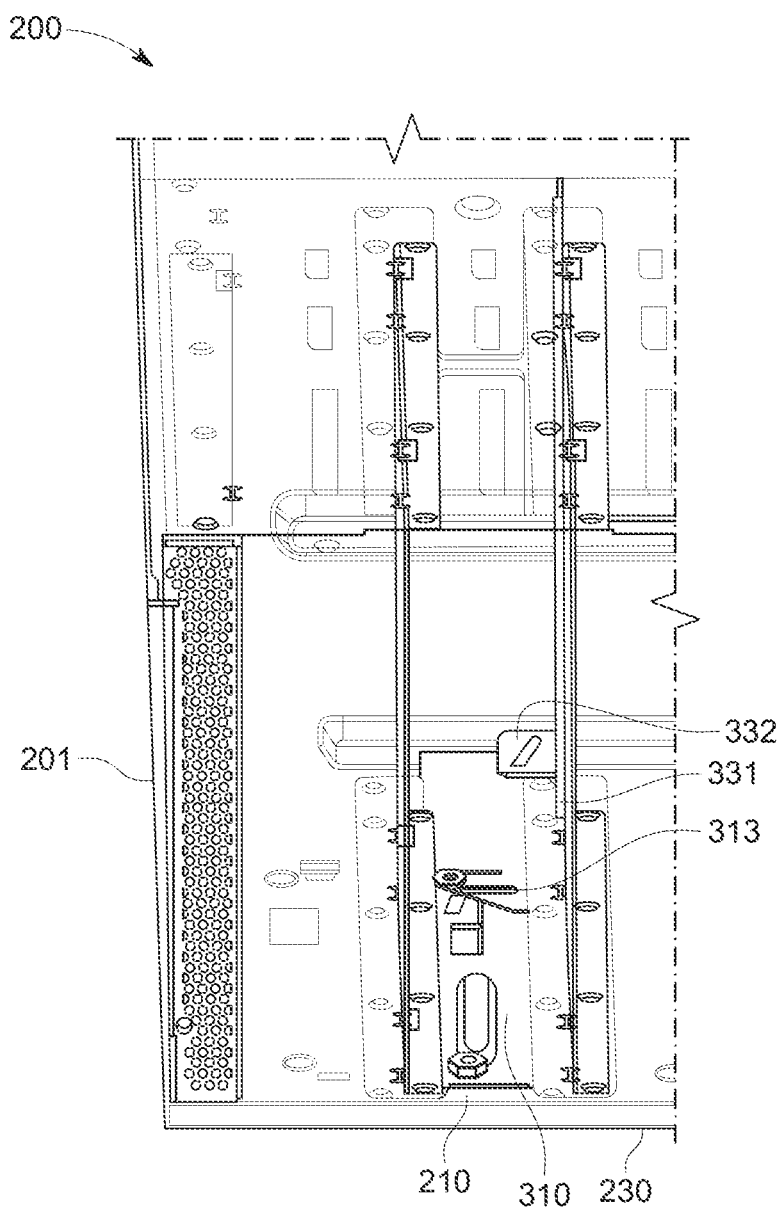

As exemplified in FIGS. 3A, 4A and 7A, the movable flap 330 is in the closed position when the computing node 400 is absent from the slot 210. Further, as exemplified in FIGS. 3C, 4C, and 7B, the movable flap 330 is in the open position when the computing node 400 is fully inserted within the respective slot 210. (The computing node 400 not shown in FIGS. 3C and 4C.) The movable flap 330 rotates in a second direction or counterclockwise while the connecting rod 310 is rotating in the first direction, the second direction being opposite the first direction. Alternatively, the first direction may be counterclockwise, and the second direction may be clockwise depending on the design of the air-shielding mechanism 300. D in FIG. 4A shows the rotation center of the movable flap 330. FIGS. 3A-3C, FIGS. 4A-4C, and FIGS. 6A-6C show progressive opening of the movable flap 330 when the computing node 400 is inserted into the slot 210, causing pressure to move the connecting rod 310 and rotate the movable flap 330. As shown in FIGS. 4C, 6C, and 7B, an airflow path to an internal space of the server chassis 201 is established when the computing node 400 is fully inserted within the slot 210 and when the movable flap 330 is fully open. As shown in FIGS. 4C, 6C, and 7b, the main plate 331 of the movable flap 330 is parallel to the two parallel side edges 310a, 310b of the connecting rod 310 when the movable flap 330 is in the open position. Further, the main plate 331 of the movable flap 330 is also parallel to two parallel side walls of the slot 210 when the movable flap 330 is in the open position.

Referring to FIGS. 3A and FIG. 5C, when the movable flap 330 is in the closed position, the second fastener 350 is at a first position 313a within the elongated hole 313. Further, when the movable flap 330 is in the closed position, the connecting rod 310 is tilted with respect to a front side 230 (shown in FIGS. 2A, 2C, 4A-4C, 6A-6C, 7A, and 7B) of the server chassis 201 such that an angle between the connecting rod 310 or the protrusion 311 and the front side 230 of the server chassis 201 is less than 90° or 89°, 88°, 87°, 86°, or 85°. In FIGS. 3A and 5C, the angle is shown as 86°. However, the angle is not limited thereto.

Referring to FIGS. 3C and 5A, when the movable flap 330 is in the open position, the second fastener 350 is at a second position 313b within the elongated hole 313. Further, when the movable flap 330 is in the open position, the connecting rod 310 rotated in the first direction is generally vertical with respect to the front side 230 of the server chassis 201 or an angle between the rotated connecting rod 310 or the protrusion 311 and the front side 230 of the server chassis 201 is 90° or about 90°. Further, the main plate 331 of the movable flap 330 is perpendicular to the front side 230 of the server chassis 201 when the movable flap 330 is in the open position, as shown in FIGS. 4C, 6C, and 7B.

According to various embodiments of the present invention, a method for controlling the air-shielding mechanism 300 included in the computing system 200 is disclosed. As discussed above, when a computing node 400 is inserted into an empty slot 210, an opening mechanism is executed, as shown in FIGS. 3A-3C, and when the computing node 400 is released from the slot 210, a closing mechanism is executed, as shown in FIGS. 5A-5C.

In FIG. 6A, the movable flap 330 is in the closed position. Referring to FIGS. 6A, the method for controlling the air-shielding mechanism 300 includes receiving a computing node 400 within an empty slot 210. The pressure generated by contact between the computing node 400 and the connecting rod 310 or the protrusion 311 of the connecting rod 310 causes rotation of the connecting rod 310 in a first direction. Further, the pressure also causes rotation of the movable flap 330 in a second direction to open the movable flap 330 while the connecting rod 310 is rotating in the first direction, the second direction being opposite the first direction. For example, the first direction is clockwise and the second direction is counterclockwise. See FIGS. 6A-6C. However, the first direction and the second direction may be switched. The movable flap 330 is in the open position when the computing node 400 is fully inserted within the respective slot 210, as shown in FIG. 6C. FIGS. 3A-3C, 4A-4C, and 7A-7B also show the opening mechanism of the movable flap 330.

Referring to FIGS. 6C-6A, the method for controlling the air-shielding mechanism 300 further includes removing the computing node 400 from the slot 210, i.e., a reverse sequence of FIGS. 6A-6C. The closing mechanism of the movable flap 330 is discussed referring to FIGS. 5A-5C. In FIG. 5A, the movable flap 330 is in the open position. The closing mechanism includes rotating the connecting rod 300 in the second direction in response to release of the pressure, the release of the pressure caused by removal of the computing node 400 from the slot 210. The movable flap 330 rotates in the first direction to close the movable flap 330 while the connecting rod 310 is rotating in the second direction. As shown in FIG. 5C, the movable flap 330 is in the closed position when the computing node 400 is absent from the slot 210. Also see FIG. 7A showing the movable flap 330 that is in the closed position. The connecting rod 300 is tilted with respect to the front side 230 of the server chassis 201 when the movable flap 330 is in the closed position, as shown in FIGS. 5C and FIG. 7A. Thus, the computing node 400 taken out of the slot 210 can be serviced without affecting the air circulation within the internal space of the server chassis 201. That is because the movable flap 330 is closed, preventing airflow being introduced from the outside of the server chassis 201 into the internal space of the server chassis 201.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular examples only and is not intended to be limiting of the disclosure. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this disclosure belongs. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above-described embodiments. Rather, the scope of the disclosure should be defined in accordance with the following claims and their equivalents.

What is claimed is:

1. A computing system comprising:
 a server chassis with a slot configured to receive a computing node, the slot having an opening through which the computing node is insertable;
 an air-shielding mechanism positioned within the slot and having
  a connecting rod movably coupled within the slot, the connecting rod rotating in a first direction in response to pressure generated by contact between the computing node and the connecting rod, the pressure being generated when the computing node is inserted within the slot, and
  a movable flap coupled to the connecting rod and being rotatable between an open position and a closed position, the movable flap being in the closed position when the computing node is absent from the slot, the movable flap being in the open position when the computing node is fully inserted within the respective slot, the movable flap rotating in a second direction while the connecting rod is rotating in the first direction, the second direction being opposite the first direction;
a first fastener rotatably connecting the connecting rod to a bottom plate of the server chassis, the first fastener positioned at a rotation center of the connecting rod;
a spring coupled to the connecting rod; and
a second fastener passing through an elongated hole formed on the connecting rod, the second fastener movably connecting the connecting rod to the bottom plate of the server chassis, the second fastener holding the spring;
wherein the second fastener initially positioned at a first position within the elongated hole is eventually positioned at a second position within the elongated hole when the spring is pressed in response to insertion of the computing node within the slot.

2. The computing system of claim 1, wherein a protrusion is formed on an upper side of the connecting rod, the protrusion extending generally vertically from a surface of the upper side.

3. The computing system of claim 2, wherein the protrusion is a generally rectangular portion of the connecting rod that is raised generally vertically with respect to the surface of the upper side of the connecting rod, three of four sides of the generally rectangular portion having been cut from the connecting rod and one of the four sides remaining attached to the connecting rod such that a generally rectangular opening is formed on the connecting rod next to the protrusion.

4. The computing system of claim 3, wherein the protrusion is generally parallel to two parallel side edges of the connecting rod.

5. A multi-node computing system comprising:
a server chassis with a plurality of slots configured to receive, respectively, a plurality of computing nodes, each slot of the plurality of slots having an opening through which a respective computing node is insertable; and
a plurality of air-shielding mechanisms positioned, respectively, at the plurality of slots, each air-shielding mechanism of the plurality of air-shielding mechanisms having
a connecting rod movably coupled within the server chassis, the connecting rod rotating in a first direction in response to pressure generated by contact between a respective computing node and the connecting rod, the pressure being generated when the respective computing node is inserted within a respective slot of the plurality of slots, and
a movable flap rotatably coupled to the connecting rod, the movable flap rotating in a second direction while the connecting rod is rotating in the first direction, the second direction being opposite the first direction, the movable flap rotating between a closed position and an open position, the movable flap being in the closed position when the respective computing node is absent from the respective slot, the movable flap being in the open position when the respective computing node is fully inserted within the respective slot.

6. The multi-node computing system of claim 5, wherein a protrusion is formed on an upper side of the connecting rod, the protrusion extending generally vertically from a surface of the upper side.

7. The multi-node computing system of claim 6, wherein the protrusion is a generally rectangular portion of the connecting rod that is raised generally vertically with respect to the surface of the upper side of the connecting rod, three of four sides of the generally rectangular portion having been cut from the connecting rod and one of the four sides remaining attached to the connecting rod such that a generally rectangular opening is formed on the connecting rod next to the protrusion.

8. The multi-node computing system of claim 7, wherein the protrusion is generally parallel to two parallel side edges of the connecting rod.

9. The multi-node computing system of claim 6, wherein the protrusion of the connecting rod is configured to contact the respective computing node inserted to the respective slot through the respective opening.

10. The multi-node computing system of claim 9, wherein the connecting rod is configured to rotate clockwise in response to the pressure generated by contact between the inserted computing node and the protrusion of the connecting rod.

11. The multi-node computing system of claim 10, wherein the movable flap is configured to rotate counterclockwise in response to the pressure, the movable flap being opened progressively according to the rotation of the movable flap until the computing node is fully inserted within the slot.

12. The multi-node computing system of claim 11, wherein an airflow path to an internal space of the server chassis is established when the computing node is fully inserted within the slot and when the movable flap is fully open.

13. The multi-node computing system of claim 5, wherein the movable flap is rotatably coupled to the connecting rod via a fastener comprising a pin or screw.

14. The multi-node computing system of claim 13, wherein the movable flap comprises:
a main plate extending generally vertically with respect to a surface of an upper side of the connecting rod; and
a coupling portion coupled to one side of the main plate, and
wherein the coupling portion comprises:
a first part coupled to the one side of the main plate via at least one fastener; and
a second part generally vertically extending from the first part such that the upper side of the connecting rod and an upper side of the second part of the coupling portion are parallel, the fastener penetrating the second part of the coupling portion of the movable flap.

15. The multi-node computing system of claim 5, further comprising:
a first fastener rotatably connecting the connecting rod to a bottom plate of the server chassis, the first fastener positioned at a rotation center of the connecting rod;
a spring coupled to the connecting rod; and
a second fastener passing through an elongated hole formed on the connecting rod, the second fastener connecting the connecting rod to the bottom plate of the server chassis, the second fastener holding the spring.

16. The multi-node computing system of claim 15, wherein when the movable flap is in the closed position:
the second fastener is at a first position within the elongated hole; and
the connecting rod is tilted with respect to a front side of the server chassis such that an angle between the connecting rod and the front side of the server chassis is less than 90° or 89°, 88°, 87°, 86°, or 85°.

17. The multi-node computing system of claim 16, wherein when the movable flap is in the open position:
   the second fastener is at a second position within the elongated hole; and
   the connecting rod rotated in the first direction is generally vertical with respect to the front side of the server chassis or an angle between the rotated connecting rod and the front side of the server chassis is 90° or about 90°.

18. A method for controlling an air-shielding mechanism included in a computing system, wherein the computing system comprises a server chassis with a slot configured to receive a computing node, the slot having an opening through which the computing node is insertable, the air-shielding mechanism positioned within the slot,
   wherein the air-shielding mechanism comprises:
      a connecting rod movably coupled within the slot;
      a movable flap coupled to the connecting rod and being rotatable between an open position and a closed position,
      a first fastener rotatably connecting the connecting rod to a bottom plate of the server chassis, the first fastener positioned at a rotation center of the connecting rod;
      a spring coupled to the connecting rod; and
      a second fastener passing through an elongated hole formed on the connecting rod, the second fastener movably connecting the connecting rod to the bottom plate of the server chassis, the second fastener holding the spring;
   wherein the method comprises:
      receiving the computing node within the slot;
      rotating the connecting rod in a first direction in response to pressure generated by contact between the received computing node and the connecting rod; and
      rotating the movable flap in a second direction to open the movable flap while the connecting rod is rotating in the first direction, the second direction being opposite the first direction;
   wherein the movable flap is in the open position when the computing node is fully inserted within the respective slot
   wherein the second fastener initially positioned at a first position within the elongated hole is eventually positioned at a second position within the elongated hole when the spring is pressed in response to insertion of the computing node within the slot.

19. The method of claim 18, further comprising:
   removing the computing node from the slot;
   rotating the connecting rod in the second direction in response to release of the pressure, the release of the pressure caused by removal of the computing node from the slot; and
   rotating the movable flap in the first direction to close the movable flap while the connecting rod is rotating in the second direction,
   wherein the movable flap is in the closed position when the computing node is absent from the slot.

20. A computing system comprising:
   a server chassis with a slot configured to receive a computing node;
   an air-shielding mechanism positioned within the slot and having
      a connecting rod movably coupled within the slot, and
      a movable flap coupled to the connecting rod and being rotatable between an open position and a closed position, the movable flap being in the closed position when the computing node is absent from the slot, the movable flap being in the open position when the computing node is fully inserted within the respective slot;
   a first fastener rotatably connecting the connecting rod to a bottom plate of the server chassis, the first fastener positioned at a rotation center of the connecting rod;
   a spring coupled to the connecting rod; and
   a second fastener passing through an elongated hole formed on the connecting rod, the second fastener movably connecting the connecting rod to the bottom plate of the server chassis, the second fastener holding the spring;
   wherein the second fastener initially positioned at a first position within the elongated hole is eventually positioned at a second position within the elongated hole when the spring is pressed in response to insertion of the computing node within the slot.

* * * * *